United States Patent [19]
Peterson et al.

[11] 3,965,374
[45] June 22, 1976

[54] CIRCUIT FOR CONTROLLING THE SWITCHING TIMES OF INVERTING SWITCHING DEVICES

[75] Inventors: William Anders Peterson, Lake Parsippany; James Carroll Wadlington, Summit, both of N.J.

[73] Assignee: Bell Telephone Laboratories, Incorporated, Murray Hill, N.J.

[22] Filed: May 5, 1975

[21] Appl. No.: 574,428

[52] U.S. Cl. .............................. 307/318; 307/253; 307/315; 307/293
[51] Int. Cl.² .......................................... H03K 17/00
[58] Field of Search ....... 307/253, 318, 315, 293 H, 307/293 K, 293 L; 330/110

[56] References Cited
UNITED STATES PATENTS

| | | |
|---|---|---|
| 3,094,675 | 6/1963 | Ule .................................. 307/318 |
| 3,163,779 | 12/1964 | Leightner ........................... 307/318 |
| 3,293,451 | 12/1966 | Henning et al. .................... 307/318 |

Primary Examiner—Stanley D. Miller, Jr.
Assistant Examiner—B. P. Davis
Attorney, Agent, or Firm—H. L. Logan

[57] ABSTRACT

Disclosed is a circuit for controlling the switching duration of inverting switching devices. The circuit comprises a capacitor connected to the output of the controlled switching device, a resistor connected between the capacitor and a common terminal, and a double Zener diode connected between the switching device's input and the capacitor-resistor junction.

8 Claims, 2 Drawing Figures

CIRCUIT FOR CONTROLLING THE SWITCHING TIMES OF INVERTING SWITCHING DEVICES

BACKGROUND OF THE INVENTION

1. Field of the Invention

This invention relates to switching circuits.

2. Description of the Prior Art

In the context of this application, switching circuits are circuits employing electronic switching devices which comprise an element or a circuit that is primarily adapted for switching electrical signals in response to a control signal. Inverting switching devices are switching devices whose output signal is high when the control (input) signal is low, and vice-versa.

Electronic switching devices have long been used for switching of signals. Unlike ideal switches, however, electronic switching devices take a finite time duration to switch and dissipate energy during the switching time interval. This consumed power may become significant with respect to circuit operation and switch power dissipation capacity when switching durations are long and when switching repetition rates are high. To reduce this consumed and wasted power, high speed switching devices are generally employed.

The use of high speed switching devices, however, has a number of disadvantages. One, for example, is that high switching speeds induce large voltage and current transition rates ($dv/dt$ and $di/dt$). The large transition rates cause noise to be radiated to the detriment of the immediate switching circuit and of the surrounding electronic apparatus. Another disadvantage is that high speed switching may cause a breakdown in the switching devices, especially when inductive loads are driven. In transistors this breakdown is called a secondary breakdown.

The high switching speed problems can be avoided by the use of only a moderately fast switching device, or by the slowing-down of a fast switching device by means of a capacitor connected between the device's output terminal and ground. With such slowing-down, however, the switching time of a device is still a function of the device's parameters, and of the slow-down capacitor's value. Thus, two switching devices would invariably have different switching times which, if interconnected in a push-pull center-tapped transformer configuration, would raise the possibility of both devices conducting simultaneously. Simultaneous conduction markedly increases the devices' power dissipation.

SUMMARY OF THE INVENTION

It is an object of this invention, therefore, to cause inverting switching devices to switch in a predetermined time duration.

It is another object of this invention to cause the switching time of inverting switching devices to be essentially independent of their switching parameters.

These and other objects are achieved by connecting a capacitor to the output of the switching device, by connecting a resistor between the capacitor and a common terminal, generally called ground, and by connecting a double Zener diode between the device's input and the capacitor-resistor junction point.

In operation, when the switching device reverses states, the conducting Zener diode, in cooperation with the resistor, causes an essentially constant current to flow through the capacitor. The constant current charges the capacitor and causes the switching device's output voltage to change its level linearly. The slope of the linear level transition is strictly a function of the capacitor value, the resistor value, and the Zener breakdown voltage of the Zener diode. Thus, the transition slope and the switching time are essentially independent of the switching device's parameters.

DETAILED DESCRIPTION

Figure 1:
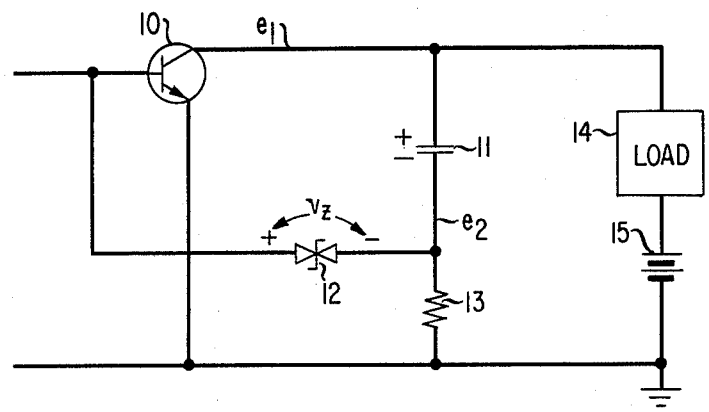
FIG. 1 depicts an embodiment of this invention employing an inverting switching device comprising of a single switching transistor.

In FIG. 1, switching transistor 10 is connected in a common emitter configuration. That is, its input switching voltage between the base and the emitter of the transistor, and a load 14 is connected between the collector and a voltage source 15 ($V_{cc}$). The negative side of the voltage source is connected to the transistor's emitter and to a terminal of fixed potential, commonly called ground. One lead of a capacitor 11 (of value $C_1$) is connected to the collector of transistor 10. The other lead of capacitor 11 is connected to one lead of a resistor 13 (of value $R_1$) and to one lead of a double Zener diode 12. The other lead of resistor 13 is connected to the emitter of transistor 10, and the other lead of the diode 12 is connected to the base of transistor 10.

Figure 2:
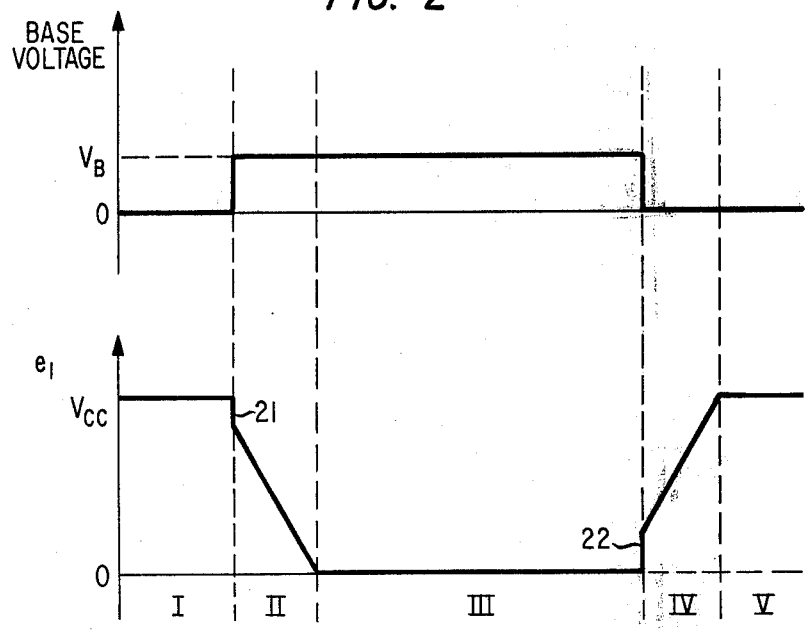
FIG. 2 illustrates the base voltage and the corresponding collector voltage of the FIG. 1 switching transistor.

FIG. 2 illustrates the collector voltage transitions of the FIG. 1 circuit in response to the base voltage transitions. In accordance with FIG. 2, in Region I the base voltage is zero. When base voltage is zero, transistor 10 is off and its collector voltage (designated $e_1$ in FIG. 1) is equal to the $V_{cc}$. Also when transistor 10 is off, no DC current flows through diode 12 and resistor 13, the voltage at the diode-resistor junction (designated $e_2$ in FIG. 1) is zero, and capacitor 11 is charged to $V_{cc}$ with the positive polarity being on the lead connected to the transistor's collector.

When the transistor base voltage is increased to voltage $V_B$ to cause transistor 10 to conduct, voltage $e_1$ begins to decrease towards zero. Since the voltage across a capacitor cannot change instantaneously, voltage $e_2$ follows voltage $e_1$ and becomes negative by an amount equal to the decrease in voltage $e_1$. The potential difference across the Zener diode, $v_Z$, is equal to the base voltage, minus the voltage $e_2$. When this voltage equals the Zener breakdown voltage, $Z_Z$, the diode starts to conduct. This occurs when $e_2$ equals $V_B - V_Z$. When the Zener diode 12 conducts (with current $i_Z$), voltage $e_2$ is clamped to $V_B - V_Z$ causing a constant current of magnitude $(V_B - V_Z)/R_1$ to flow through resistor 13 and causing a current of magnitude $(V_B - V_Z)/R_1 - i_Z$ to flow through capacitor 11. Since $e_2$ is clamped to a fixed potential, and since the capacitor voltage can change only in response to a charging current, it follows that voltage $e_1$ cannot decrease to zero instantaneously. The only (relatively) instantaneous change occurs in the initial drop in $e_1$ prior to the breakdown of Zener diode 12. This initial voltage drop of $e_1$ is illustrated in FIG. 2 by the vertical line 21 on the border between Regions I and II.

It should be noted that for reasonably high gain transistors ($B >> 10$) the designed maximum base current is quite small, and consequently the Zener diode current $i_Z$ is also small. If $i_Z$ were to approach the base current the base voltage would drop below $V_B$, the transistor would turn off, voltages $e_1$ and $e_2$ would rise and Zener diode 12 would also turn off, reducing the value of $i_Z$. Thus, it can be seen that $i_Z$ is, at most, of the same order of magnitude as the base current. The current $(V_B - V_Z)/R_1$ is an order of magnitude greater than $i_Z$. Accordingly, the $i_Z$ component of the capacitor's current may be neglected, leaving a current of $(V_B - V_Z)/R_1$.

The signal $V_B$, which is the turn on voltage of the switching transistor is generally small compared to practical values of Zener diode breakdown voltage $V_Z$. Additionally, $V_B$ is relatively constant, and is only slightly affected by transistor parameters. Thus, the charging current $(V_B - V_Z)/R_1$ is essentially independent of transistor parameters. This charging current causes the voltage $e_1$ to descend linearly in accordance with the relationship $(V_B - V_Z)\Delta t/R_1C_1$ until the collector voltage reaches zero potential. This is shown in Region II of FIG. 2.

When $e_1$ reaches zero potential (actually to $V_{CEsat}$), the voltage $e_2$ rises toward zero potential. This rise is exponential with an $R_1C_1$ time constant. Of course, as soon as the $e_2$ voltage above $V_B - V_Z$, Zener diode 12 ceases to conduct.

At the end of Region II, the FIG. 1 circuit assumes a stable on state. This is illustrated by Region III of FIG. 2.

When transistor 10 is turned off by removing its base current, the collector voltage $e_1$ begins to rise toward $V_{cc}$. Since the voltage across capacitor 12 cannot change instantaneously, voltage $e_2$ rises by an amount equal to the rise in voltage $e_1$, until voltage $e_2$ reaches the voltage $V_B + V_Z$. When $e_2$ reaches the potential $V_B + V_Z$ the base voltage of transistor 10 becomes large enough to allow base current, and Zener diode 12 starts to conduct in a direction opposite to the direction of conduction during turn-on, i.e., the Zener diode current flows from the diode-resistor junction into the transistor's base. The conducting Zener diode clamps the resistor 13 voltage $e_2$ to $V_B + V_Z$ and limits the current flowing through resistor 13 to $(V_B + V_Z)/R_1$. This constant current is essentially the current that flows through capacitor 12, charging the capacitor, and linearly raising the voltage $e_1$ in accordance with the relation $(V_B + V_Z)\Delta t/R_1C_1$. This linear rise in voltage $e_1$ (toward $V_{cc}$) is illustrated in Region IV of FIG. 2. The vertical voltage rise between Regions III and IV (line 22) corresponds to the almost instantaneous rise in the voltage $e_1$ before Zener diode 12 starts to conduct.

When voltage $e_1$ reaches $V_{cc}$, capacitor 12 continues to charge, lowering the voltage $e_2$ towards zero potential in an exponential manner with an $R_1C_1$ time constant. As soon as voltage $e_2$ drops below $V_B + V_Z$, the Zener diode ceases to conduct. Thus, a stable off state is reached by transistor 10. This state is depicted by Region V of FIG. 2.

A switching transistor, of course, is merely a specie of the inverting switching devices class. Accordingly, it is to be understood that the embodiment shown and described herein is merely illustrative of the principles of this invention, and that modifications of same may be implemented by those skilled in the art without departing from the spirit and scope of this invention. For example, transistor 10 may be replaced by a Darlington transistor pair providing an exceptionally high gain switching device. The transistor 10 may also be replaced, for example, by an analog inverting amplifier, a feedback amplifier, or by a digital gate. In all instances, the switching times of the inverting devices are controlled by the capacitor, the resistor, and the Zener diode of the circuit depicted in FIG. 1.

What is claimed is:

1. A circuit for controlling the switching time of an inverting switching device comprising:
   a capacitor for connection to the output terminal of said inverting switching device;
   a resistor connected between said capacitor and a terminal of fixed potential; and
   a double Zener diode having one lead connected to said capacitor and having the other lead for connection to the input terminal of said inverting switching device.

2. A circuit for controlling the switching speed of inverting switching devices comprising:
   a capacitor having one lead for connection to the output terminal of an inverting switching device and having the other lead connected to a first terminal;
   a resistor having one lead connected to said first terminal and having the other lead connected to a second terminal; and
   a double Zener diode having one lead connected to said first terminal and having the other lead adapted for connection to the input terminal of said inverting switching device.

3. A switching circuit comprising:
   an inverting switching device having an input and an output terminal and a ground terminal;
   a capacitor connected between said output terminal of said inverting switching device and a first terminal;
   a resistor connected between said first terminal and said ground terminal;
   a double Zener diode connected between said first terminal and said input terminal of said inverting device.

4. The circuit of claim 3 wherein said switching device is a transistor.

5. The circuit of claim 3 wherein said switching device is a Darlington pair of switching transistors.

6. The circuit of claim 3 wherein said switching device is an analog amplifier.

7. The circuit of claim 3 wherein said switching device is a gate.

8. An amplifier having a double Zener diode in its feedback path CHARACTERIZED IN THAT:
   in said feedback path a capacitor is connected to the output terminal of said amplifier, a resistor is connected between said capacitor and a terminal of fixed potential, and said double Zener diode is connected between the input terminal of said circuit and the capacitor-resistor connection junction.

* * * * *

UNITED STATES PATENT AND TRADEMARK OFFICE
CERTIFICATE OF CORRECTION

PATENT NO. : 3,965,374
DATED : June 22, 1976
INVENTOR(S) : William A. Peterson and James C. Wadlington It is certified that error appears in the above-identified patent and that said Letters Patent are hereby corrected as shown below:

Column 1, line 42, insert quotes around "switching time"; line 62, insert quotes around "ground". Column 2, line 20, after "voltage" insert --is applied--; line 25, insert quotes around "ground"; line 37, insert quotes around "off"; line 38, insert quotes around "off"; line 68, "B" should read --β--. Column 3, line 4, insert quotes around "off"; line 5, insert quotes around "off"; line 11, insert quotes around "turn on"; line 25, after "voltage" insert --rises--; line 28, insert quotes around "on"; line 30, insert quotes around "off"; line 39, insert quotes around "turn-on"; line 56, insert quotes around "off". Column 4, line 34, claim 2, delete "adapted".

Signed and Sealed this

Twenty-eighth Day of September 1976

[SEAL]

*Attest:*

RUTH C. MASON
*Attesting Officer*

C. MARSHALL DANN
*Commissioner of Patents and Trademarks*